United States Patent [19]

Niedrich

[11] Patent Number: 5,011,658

[45] Date of Patent: Apr. 30, 1991

[54] COPPER DOPED LOW MELT SOLDER FOR COMPONENT ASSEMBLY AND REWORK

[75] Inventor: Daniel S. Niedrich, Apalachin, N.Y.

[73] Assignee: International Business Machines Corporation, Armonk, N.Y.

[21] Appl. No.: 359,315

[22] Filed: May 31, 1989

[51] Int. Cl.$^5$ ............................................. C22C 13/00
[52] U.S. Cl. .................................. 420/558; 420/560; 420/570; 420/573; 420/587; 420/589; 228/263.11; 228/263.18; 228/180.1
[58] Field of Search ............... 420/558, 559, 560, 570, 420/573, 587, 589; 228/263.11, 263.18, 180.1; 428/674, 675

[56] References Cited

U.S. PATENT DOCUMENTS

| | | | |
|---|---|---|---|
| 2,243,278 | 5/1941 | Johnson | 420/560 |
| 2,303,193 | 11/1942 | Bouton et al. | 75/166 |
| 2,471,899 | 5/1949 | Regner | 420/559 |
| 2,501,859 | 3/1950 | Babbitt et al. | 420/558 |
| 2,671,844 | 3/1954 | Laubmeyer et al. | 420/570 |
| 3,607,252 | 9/1971 | North | 420/559 |
| 3,650,735 | 3/1972 | Monaco | 420/560 |
| 4,070,192 | 1/1978 | Arbib et al. | 420/566 |
| 4,106,930 | 8/1978 | Nomaki et al. | 420/559 |
| 4,357,162 | 11/1982 | Guan | 420/560 |
| 4,396,677 | 8/1983 | Intrater et al. | 420/557 |
| 4,512,950 | 4/1985 | Hosoda et al. | 420/557 |
| 4,588,657 | 5/1986 | Kujas | 420/558 |
| 4,622,205 | 11/1986 | Fouts et al. | 420/566 |
| 4,654,275 | 3/1987 | Bose et al. | 420/566 |
| 4,695,428 | 9/1987 | Ballentine et al. | 420/560 |

FOREIGN PATENT DOCUMENTS

| | | | |
|---|---|---|---|
| 18219 | 9/1967 | Japan | 420/558 |
| 166191 | 8/1985 | Japan . | |
| 72496 | 4/1987 | Japan | 420/570 |
| 266034 | 11/1988 | Japan . | |
| 270437 | 11/1988 | Japan . | |
| 601029 | 4/1948 | United Kingdom | 420/560 |
| 1461371 | 1/1977 | United Kingdom | 420/559 |
| 2158459 | 11/1985 | United Kingdom | 420/560 |

OTHER PUBLICATIONS

Metals Technology, Feb. 1975, "Effect of Certain Impurity Elements on the Wetting Properties of 60% Tin-40% Lead Solders", pp. 73-85.
Webster's Unabridged Dictionary of the English Language, p. 1500, published 1989 by Portland House, New York.
Mechanics of Patent Claim Drafting by John Landis, 2d. ed., pp. 143-167, published Nov. 1974 by Practising Law Institute, New York.
Metals Handbook 8th ed., vol. 8, p. 299, 1973.
Research Disclosure, Apr. 1989, No. 300, Kenneth Mason Publications, Ltd., England, "Copper Enhanced Solder Paste".
IBM Technical Disclosure Bulletin, Aug., 1976, p. 834, "Component Rework with Low Melt Solder".
Solders and Soldering, H. H. Manko, 1964, pp. 65-66, McGraw-Hill Book Co., New York, London, Toronto.
Properties of Solders, Product flyer from Multicore on Savbit Solder, from Multicore, Cantiague Rock Road, Westbury, New York, 11590, undated.
"Wetting Properties of Tin-Lead Solders", journal article in Metals Technology, Feb., 1975 by Ackroyd et al., pp. 73-85.
Metals Handbook, Desk Edition, by the American Society for Metals, pp. 28-34, Metals Park, Ohio, copyright 1985.

Primary Examiner—John P. Sheehan
Attorney, Agent, or Firm—Judith D. Olsen

[57] ABSTRACT

Low melting temperature copper-containing solders are disclosed for soldering and rework on copper surfaces. The amount of copper required in the solder in order to inhibit dissolution of the copper surface to be soldered has been found to be dopant level, below the binary tin-copper eutectic point.

3 Claims, 7 Drawing Sheets

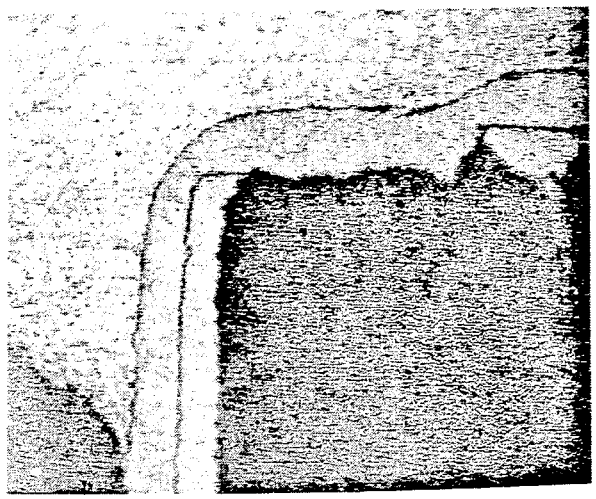
FIG.1
FIG.2
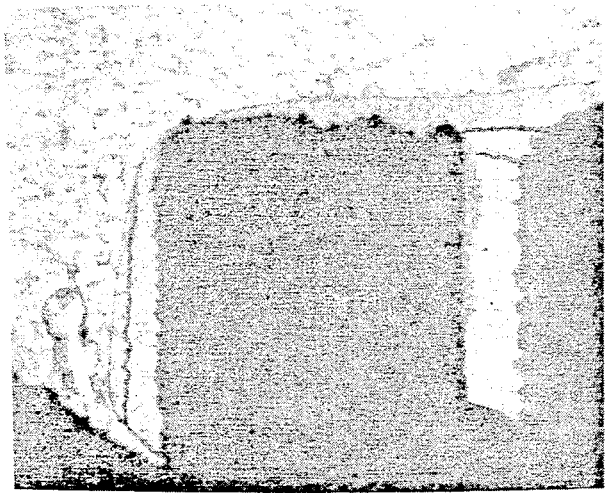
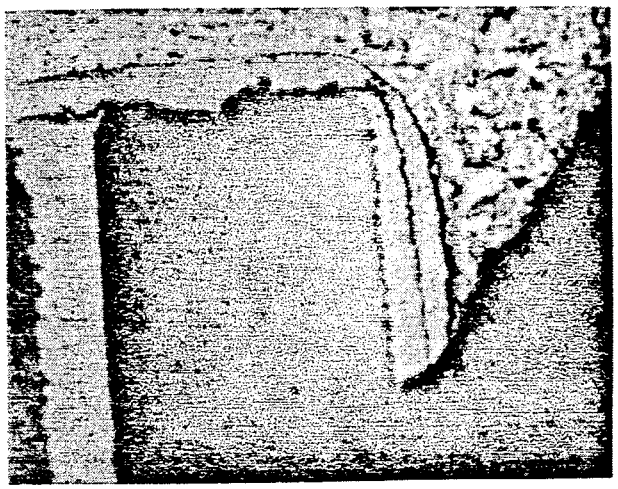
FIG.3

FIG. 4

| COMPOSITION IDENTIFIER | SOLDER COMPOSITION BY WT % | | |
|---|---|---|---|
| | SN | PB | CU |
| T1 | 62.79 | 37.08 | 0.13 |
| T2 | 62.83 | 36.76 | 0.41 |
| T3 | 62.35 | 36.93 | 0.82 |
| T4 | 62.15 | 36.50 | 1.35 |
| T5 | 62.07 | 36.41 | 1.52 |
| P1 | 60.75 | 38.78 | 0.47 |
| P2 | 60.70 | 38.22 | 1.08 |
| S1 | 64.75 | 34.85 | 0.40 |
| S2 | 64.58 | 34.59 | 0.83 |

FIG. 5

| ALLOY | ALPHA 941 FLUX | | HIGH GRADE 1042 FLUX | |
|---|---|---|---|---|
| | PERCENT SPREAD | DESCRIPTION | PERCENT SPREAD | DESCRIPTION |
| T-1 | 93.4 | EXCELLENT | 95.6 | PERFECT |
| T-2 | 94.1 | EXCELLENT | 96.2 | PERFECT |
| T-3 | 92.4 | EXCELLENT | 89.4 | VERY GOOD |
| T-4 | 89.9 | VERY GOOD | 88.2 | VERY GOOD |
| T-5 | 84.0 | GOOD | 84.2 | GOOD |
| P-1 | 93.3 | EXCELLENT | 94.7 | EXCELLENT |
| P-2 | 91.6 | EXCELLENT | 93.2 | EXCELLENT |
| S-1 | 93.5 | EXCELLENT | 93.0 | EXCELLENT |
| S-2 | 91.8 | EXCELLENT | 89.3 | VERY GOOD |

| CALCULATED ANGLE | DESCRIPTION | SPREAD FACTOR % |
|---|---|---|
| UP TO 70 | VERY POOR | UP TO 60 |
| 70-55 | POOR TO FAIL | 60-70 |
| 55-40 | ADEQUATE | 70-80 |
| 40-30 | GOOD | 80-85 |
| 30-20 | VERY GOOD | 85-90 |
| 20-10 | EXCELLENT | 90-95 |
| 10-0 | PERFECT | 95-100 |

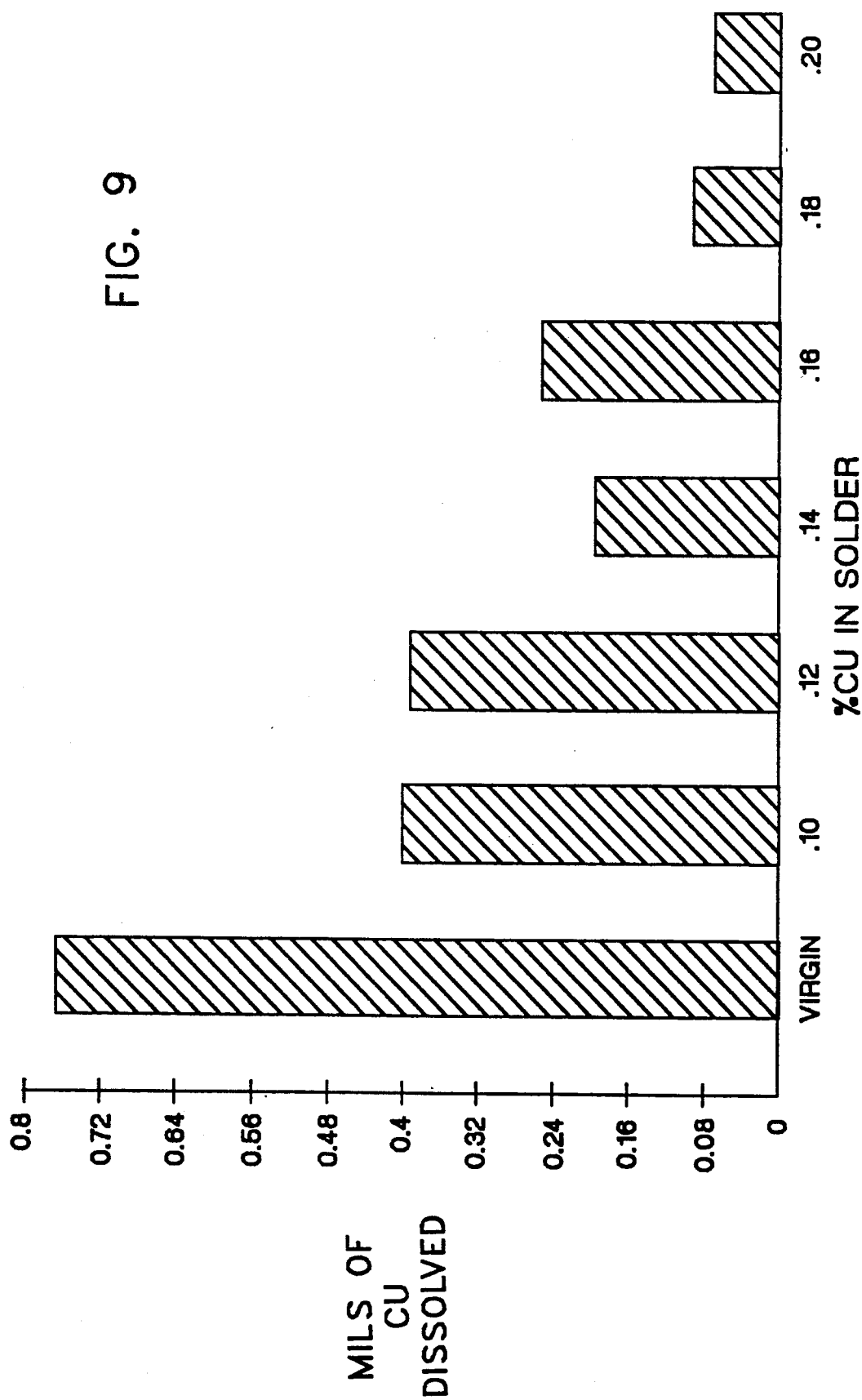

COPPER DOPED LOW MELT SOLDER FOR COMPONENT ASSEMBLY AND REWORK

BACKGROUND OF THE INVENTION

This invention relates to a composition of solder suitable for low temperature soldering and rework of printed circuit boards.

More specifically, this invention relates to a composition of low temperature solder comprising tin, in which is also present a dopant level of copper in an amount below the binary tin-copper eutectic point. The new solder may be applied to the material to be soldered using solder fountain and other conventional soldering techniques. Because of its low melting point relative to other copper containing solders, the new solder may be used for nondestructive soldering of materials not amenable to being soldered by copper containing solders available heretofore.

Most specifically, this invention relates to a composition of copper doped low temperature solder suitable for use in component assembly and rework on printed circuit cards or boards.

There has been a wide range of solder compositions reported in the art. By a judicious choice of elemental ingredients and proportions, solders have been devised for a number of specific applications, such as to wet and bond to carbon and semiconductors (U.S. Pat. No. 4,512,950 to Hosoda et al, issued Apr. 23, 1985 and U.S. Pat. No. 4,396,677 to Intrater, issued Aug. 2, 1983), to inhibit the formation of oxide (U.S. Pat. No. 4,654,275 to Bose, issued Mar.31, 1987, to increase tensile strength (U.S. Pat. No. 4,588,657 to Kujas, issued May 13, 1986), to soft solder aluminum (U.S. Pat. No. 4,070,192 to Arbib et al, issued Jan. 24, 1978, to bond semiconductor to metal (U.S. Pat. No. 4,357,162 to Guan, issued Nov. 2, 1982), to bond oxide surfaces using vibration (U.S. Pat. No. 4,106,930 to Nomaki et al, issued Aug. 15, 1978), to solder joints for lead-free potable water (U.S. Pat. No. 4,695,428 to Ballentine et al, issued Sept. 22, 1987), and to improve the tarnish resistance of jewelry (U.S. Pat. No. 3,650,735 to Monaco, issued Mar. 21, 1972).

However, the problem which is solved by the present invention is quite different: how to assemble and rework a through hole connection in a printed circuit device in such a manner that the dissolution of a copper coating on the walls of the through hole connection into the solder is suppressed. Rework is reflowing the solder in the joint. The present invention is directed to a novel solder composition which retards the dissolution of copper within and surrounding a through hole or blind via and operates at a lower temperature than before possible with available copper containing solders, permitting assembly and repeated rework of faulty solder connections in and around the through holes of printed circuit boards while also avoiding other problems associated with higher temperature rework, such as delamination of layers in the laminate board, localized mechanical distortion, and degeneration of solder joints and exceeding the critical temperature of the mounted device.

In U.S. Pat. No. 2,671,844 to Laubmeyer et al, issued Mar. 9, 1954, it is recognized that the addition of an amount of copper to a tin/lead solder slows the wear of an electrical soldering bit made of copper, which tended to dissolve in the solder. The addition of 3% copper to the solder reduced the rate of dissolution of the copper bit by 25%, and 5% copper reduced the rate to 10% of the rate it was with no copper present in the solder. Any effect on soldering temperature as a result of the addition of the copper to the solder was not described, and this technique became obsolete with the advent of nonreactive bits and non-contact soldering methods. The '844 patent described that it was "essential that an eutectic of tin and copper should form in the (solder) alloy", that eutectic consisting of 99% Sn and 1% Cu (see column 2, lines 30–37). It also described that whatever the amount of copper in the solder, it should be minimally sufficient to form this binary tin-copper eutectic point. Thus in a 50/50 Pb/Sn solder, Cu in the amount of 0.5% of the total weight of the solder should be added.

In U.S. Pat. No. 4,622,205 to Fouts et al, issued Nov. 11, 1986, copper in Pb/Sn solder in a certain amount extended the life of copper conductor lines by decreasing electromigration between the solder joint and the line during the passage of current at an operating range of 50° C.–90° C. The source of the difficulty with respect to electromigration was attributed to non-uniform distribution of intermetallic particles of $Cu_3Sn$ and trace $Cu_6Sn_5$ in the solder. The solution to the problem was identified as adding to the solder an element which forms an intermetallic alloy with tin, such as copper, in an amount at least about 0.5% to less than about 10% of the solder, preferably 3.5 wt. % Cu, to slow grain boundary diffusion, thereby reducing the tendency to electromigration and thermomigration.

Copper containing solder has been obtainable on the marketplace since at least about 1964, the publication date of *Solders and Soldering*, pp. 65–66 McGraw-Hill Book Co., H. H. Manko. However, this reference does not give specific compositions of commercially available copper containing solders, saying only that the amount is "high".

A commercially available product called Savbit 1 alloy, obtainable from Multicore of Westbury, NY, comprising about 1.5% to about 2.0% Cu by weight, has been used to extend the life of copper soldering tips in static hand soldering applications. Product data sheets, however, recommend a minimum bit temperature of 272°–294° C., above the range required for nondestructive assemblies and rework on printed circuit boards and cards.

Other problems which can result from the addition of copper to solders include increase in solidification time and formation of bridges (shorts), cold solder joints, nodules and various additional defects.

SUMMARY OF THE INVENTION

It is an object of the invention to solder and rework onto copper surfaces without degrading the mechanical properties and solderability of the solder.

It is a further object of the invention to solder and rework onto a copper surface at a sufficiently low temperature to avoid mechanical and performance degradation of the device with which the copper surface is associated.

It is a further object of the invention to provide a copper containing solder which is suitable for soldering to a copper surface at low soldering temperatures.

It is a further object of the invention to solder and rework within copper plated through holes while suppressing the dissolution of the copper into the solder.

It is a further object of the invention to provide a copper containing solder suitable for soldering onto a copper surface in solder assembly and rework.

Contrary to the teachings of the art, it has been surprisingly discovered in the present invention that doping solder comprising tin to contain non-zero levels of copper in amounts below the binary tin-copper eutectic point composition significantly reduces the amount of copper dissolution from the walls of through holes into the copper doped solder during assembly and rework while not degrading the solderability of the solder or increasing the soldering temperature. Also contrary to the teachings of the art, it has been found that this effect occurs in a copper containing tin solder having a soldering temperature low enough to avoid delamination or other temperature related degradation within multilevel circuit board assemblies and provide good fatigue properties. Below the binary tin-copper eutectic point is defined as 99.1 wt. % Sn 1.9 wt. % Cu to 100 wt. % Sn as defined on page 299 of *Metallography, Structures and Phase Diagrams*, by the American Society for Metals.

BRIEF DESCRIPTION OF THE DRAWINGS

FIG. 1 shows in cross-section through the length a copper plated through hole one corner of the hole which has been soldered with nominal 54 tin/26 lead/20 indium low melt solder, but has not undergone rework. In the solder art, nominal value is the preferred actual stated value. There is an acceptable range associated with the nominal value. For example, 54 tin/26 lead/20 indium weight percent is a nominal value, with an acceptable range of plus or minus 2% to the nominal value. Magnification is 800X.

FIG. 2 shows in cross-section through the length of one corner of a copper plated through hole after four reworks with the solder used in FIG. 1, doped to contain 0.14 wt. % Cu. Magnification is 800X.

FIG. 3 shows in cross section one corner of a copper plated through hole after four reworks with the solder used in FIG. 1, undoped.

FIG. 4 shows a table identifying the composition of solders, in weight percent, which were tested in order to compile statistics which resulted in the data on solderability, copper dissolution and fatigue strength in subsequent figures.

FIG. 5 shows the behavior of the solders listed in the table of FIG. 4 when they are subjected to a standard solderability test.

FIG. 9 shows the amounts of copper dissolved from the plated walls of through holes by a copper doped ternary solder of nominal composition 54 wt. % tin/26 lead/20 indium for up to 200 seconds of exposure at about 204° C.

BRIEF DESCRIPTION OF THE PREFERRED EMBODIMENT

Figures 6A, 6B:
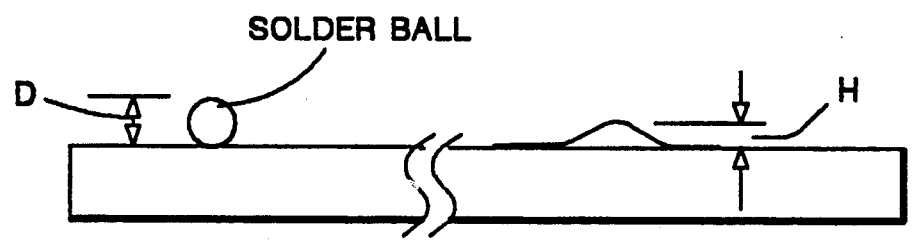
FIG. 6 shows the standard by which the solderability evaluations in the table of FIG. 5 were obtained.

Component assembly and reassembly, or rework, on a printed circuit board using a fountain process is conventionally performed by pumping a liquified solder through a chimney, which attaches the component or connector to the printed circuit board by means of a through hole. Alternatively, a wave solder technique or solder pen may be used.

The walls of the through holes of a circuit board are typically coated with copper metal which makes an electrical contact between at least two levels of circuitry. Components can be mounted onto the circuit board by means of inserting and soldering pins into through holes. Sometimes, through misalignment or misorientation of the pin and hole or because of component failure, it becomes necessary to remove or realign the defective component or soldered pin connection and remount it. This procedure is called rework. Obviously, each time this rework is performed, the board is exposed to localized heating at the point of rework. The composition of the solder is determinant of the temperature required to liquify the solder and thus perform the rework. This temperature is typically about 50° C. above the liquidus temperature of the solder composition. The solder flow rate should be kept to a minimum such that the solder remains in the region where it is desired rather than flowing beyond. The soldering time should also be kept to a minimum. The precaution of minimizing temperature, soldering time and flow rate is intended to contribute to minimizing the dissolution of copper from the walls of the conductive through hole into the solder.

One solder conventionally used is the high melt eutectic 63 wt. % Sn/37 wt. % Pb, which liquifies at 183° C. However, with increased component density on printed circuit boards and cards, it has become necessary to expose printed circuit boards to additional rework cycles. The repeated exposure to high temperature soldering contributes to degradation of the organic resins in the laminate, and may produce delamination and distortion in the localized area of the reworked component. Also, with repeated exposure to the high temperature soldering (about 183° C.+about 50° C.), greater amounts of copper dissolved from the walls of the through hole to form $Cu_3Sn$ and $Cu_6Sn_5$ orthorhombic intermetallics within the solder.

Increased component density also necessitates increased thermal loading or heat sinking of the circuit board. This increase in the capacity of devices to transfer heat away, and other advances, means that longer solder contact times are required to rework printed circuit board devices, and consequently dissolution of copper from the walls of the conductive through hole into the solder results, giving rise to the necessity of the present invention.

It has been discovered that a copper doped solder, comprising also lead and tin and optionally indium within certain nominal composition ranges is effective to permit assembly and multiple nondestructive low temperature rework of soldered through hole and blind via connections in boards and cards. It is proposed that solder compositions within the following ranges would be effective for this purpose; a trace amount meaning approximately 0.02 wt. %, an amount that may be present without being added, or which lies within the lowest error range. Trace amounts are inconsequential in effect.

tin about 53 to about 55% by weight
lead about 25 to about 27% by weight
indium about 18 to about 22% by weight
copper above trace amounts to about 0.50% by weight, the amount in a particular instance selected to be below the binary tin-copper eutectic point.

In particular, it has been found that the following nominal composition is likewise effective:
tin 54% by weight
lead 26% by weight
indium 20% by weight
copper in an amount above trace amounts selected to be below the binary tin-copper eutectic point.

In addition, it has been found that the following nominal composition is likewise effective:
tin 63% by weight
lead 37% by weight
copper in an amount above trace amounts selected to be below the binary tin-copper eutectic point.

In addition, it is proposed that the following composition would be likewise effective:
tin 99% by weight
copper above trace amounts to about 1.0% by weight, the amount in a particular instance selected to be below the binary tin-copper eutectic point.

In addition, it is proposed that the following composition would be likewise effective:
tin 50% by weight
lead 50% by weight
copper above trace amounts to about 0.5% by weight, the amount in a particular instance selected to be below the binary tin-copper eutectic point.

FIG. 1 shows in cross-section one corner of a copper plated through hole which has been soldered with nominal 54 tin/26 lead/20 indium low melt solder, but has not undergone rework. Magnification is 800X.

FIG. 2 shows in cross-section one corner of a copper plated through hole after four reworks with a solder of essentially the same nominal composition as shown in FIG. 1, but doped to contain 0.14 wt. % Cu. Magnification is 800X.

FIG. 3 shows in cross-section one corner of a copper plated through hole after four reworks with a solder being the same composition as the solder shown in FIG. 1.

The black areas of the figures are the dielectric of the circuit board. The layered intermediate areas are plated copper. The grayish area is the solder. In FIG. 1, the through hole has been soldered but has undergone no rework. In FIG. 3 by comparison, the through hole has undergone four cycles of rework and the plated copper layer is no longer electrically continuous. The through hole of FIG. 2 has, like FIG. 3, undergone four cycles of rework, the difference being that solder used in FIG. 2 is copper doped, and the plated copper layer is still electrically continuous.

The results illustrated in the above Figures are representative of results obtained consistently in soldering, rework and examining approximately 8,500 through holes.

A copper plated through hole which has undergone four reworks with conventional undoped Pb/Sn solder shows substantially no copper remaining on the through-hole walls.

FIG. 4 shows a table identifying the composition of solders in weight percent which were tested in order to compile statistics which resulted in the data on solderability, copper dissolution and fatigue strength in subsequent figures. The solder is nominally 63/37 weight percent ratio of tin and lead, to which has been added weight percents of copper dopant in amounts within the range of 0.13–1.52.

FIG. 5 shows the performance of the solder compositions listed in FIG. 4 when subjected to the standard solder ball spread test as specified in FIG. 6.

Copper doped binary solders received evaluations ranging from good to perfect with respect to solderability/wettability. Within the solder composition range, however, it can be stated generally that the best wettability is found at the lower concentrations of copper dopant, and wettability which is only good or very good is found at the higher concentrations of copper dopant. In sum, all compositions tested are acceptable. It can be expected that above 1.52 weight percent copper dopant the wettability will degrade further, being progressively and relatively worse above the binary Sn-Cu eutectic point. In addition, it may be expected that "grittiness" of the solder will be increased at dopant amounts above the binary Sn-Cu eutectic point. An article entitled "Wetting Properties of Tin-Lead Solders", in Metals Technology, February, 1975 by Ackroyd et al, pp. 73–85 further describes the negative effects of various impurities, including copper, on the wettability of tin-lead solders.

Figure 7:
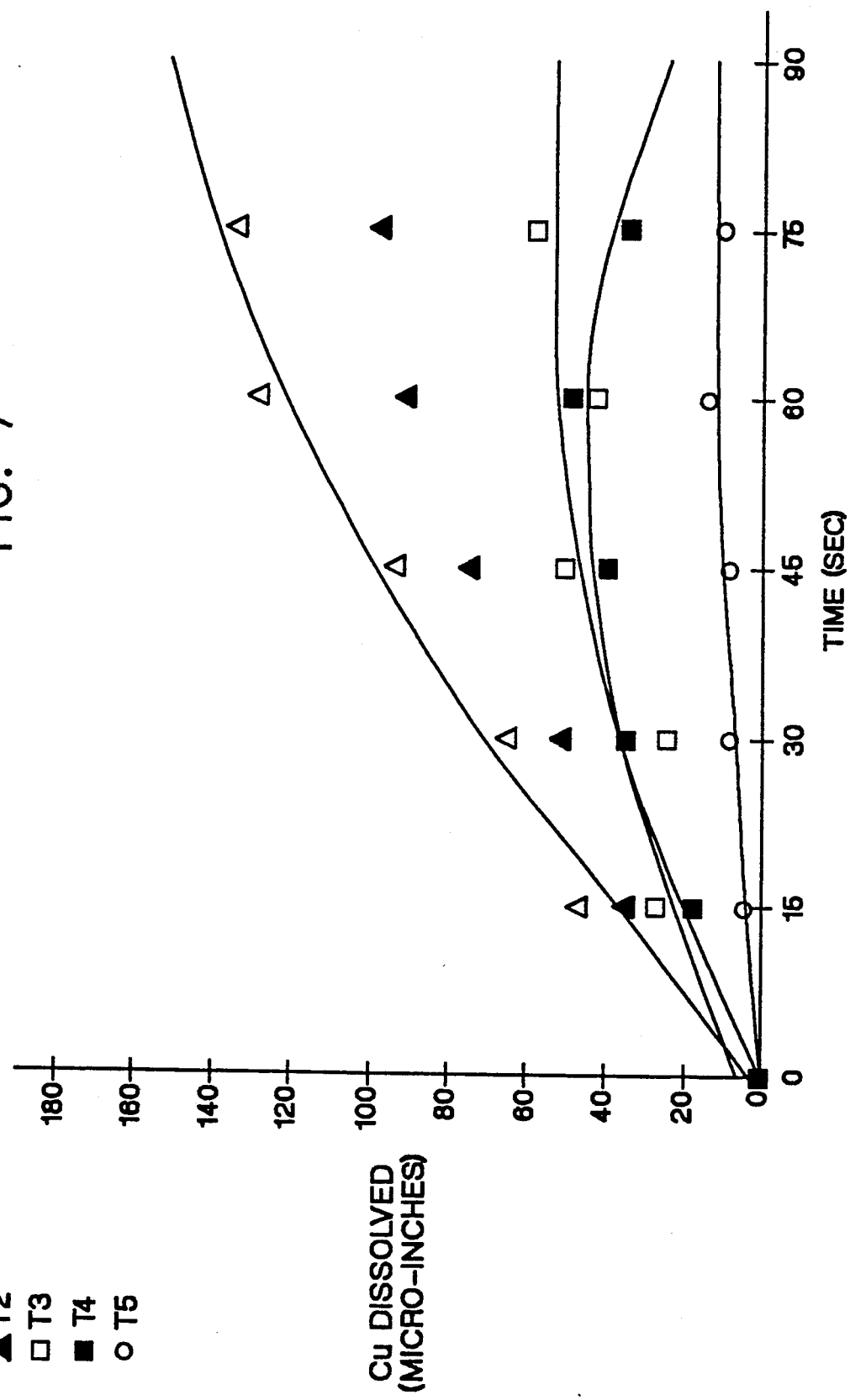
FIG. 7 shows the amounts of copper dissolved by the various solders listed in FIG. 4, for up to 75 seconds of exposure at 250° C.

FIG. 7 shows the amount of copper in microinches which dissolved into the various solder compositions identified in FIG. 4 when the copper is exposed to solder for varying amounts of time up to 75 seconds. The data were obtained in the following manner. Test vehicles were prepared by electroplating copper to a thickness of approximately 0.8 mils on a 10" by 15" foil. Test vehicles were cut into 1" by ½" test coupons. Initial non-destructive measurements were taken using X-ray fluorescence. The thickness of the copper coatings was measured on an SFT/157 fluorescent x-ray coating thickness gauge, available from SFT. Measurements were made to ±1 microinch resolution and ±150 microinch sample variation. The temperature of the solder was maintained at about 250° C., in all cases. The coupons were submerged to a depth of 10 mm into static liquid solder via a Meniscograph Wetting Balance for 15, 30, 45, 60 and 75 seconds. Final measurements were taken via metallographic cross sections. The final measurements were subtracted from the initial measurements to determine the amount of Cu dissolved. These values were averaged for each time interval and plotted on a "Cu Dissolved Vs. Time" graph. From the data in FIG. 7, it appears that the greater the weight percent copper present in the solder within the range examined, the less copper will dissolve from the walls of the through holes. On the basis of these results it can be expected that there would be only marginally less copper dissolved into the solder were the amount of copper in the solder higher than the binary tin-copper eutectic point. Therefore, from the point of view of copper dissolution there would be little point in going to a solder with a copper content above the binary tin-copper eutectic point, which would give little if any improvement in rate of copper dissolution, but would require a higher, and possibly destructive, soldering temperature.

Figure 8:
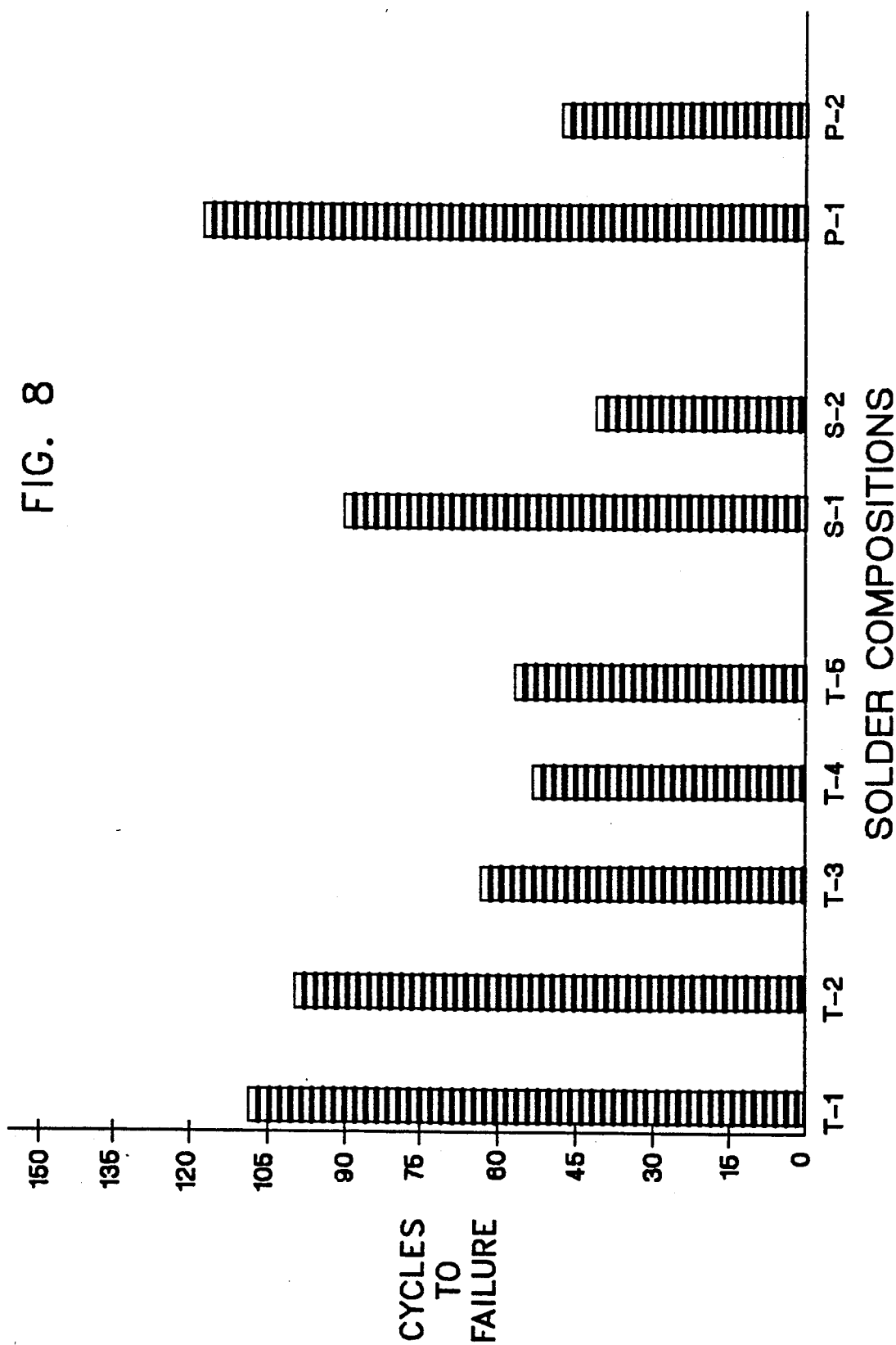
FIG. 8 shows the number of cycles to failure to which the solders listed in the table of FIG. 4 were exposed prior to joint failure due to fatigue.

FIG. 8 shows the results of fatigue testing of the solders of the various compositions which are identified in FIG. 4. The test samples were prepared and the data reported using the technique specified in ASTM #466 Axial Fatigue Testing, defined on pages 28–34 of *Metals Handbook, Desk Edition,* by the American Society for Metals. The number of cycles to failure was determined in the following manner: copper wire was soldered onto fatigue bars at either end of a central region having a diameter narrower relative to the diameter of the bar at either end. The bar was then loaded into a frequency and amplitude variable "fatigue machine" in conformity with the ASTM procedure. A chart recorder registered a graph of the resistance over time as fatigue cycles were applied at room temperature through the solder. A ten percent increase in electrical resistance was found to correspond to an eighty to ninety percent fracture of the solder, which was defined as failure. Generally speaking, the solders comprising the lower amounts of copper, 0.13–0.47 weight percent, are shown in the figure to be able to withstand the greatest number of cycles prior to failure, whereas the solders comprising the higher amounts of copper, 0.82–1.52 weight percent, are shown to be able to withstand roughly ⅓ fewer cycles prior to failure. It can be expected, therefore, that solder compositions having amounts of copper above the binary tin-copper eutectic point would present even less ability to withstand fatigue.

FIG. 9 shows the copper thickness dissolved from the walls of through holes which were exposed to a ternary solder doped with copper in amounts below the binary tin-copper eutectic point, 0.10 weight percent to 0.20 weight percent. The nominal composition of the ternary solder in ratios of weight percent was 54 tin/26 lead/20 indium, plus the copper dopant. The figure also shows for comparison purposes the amount of copper dissolved into virgin, i.e. undoped, solder. The data were obtained in the following manner: Time zero control measurements were taken on raw cards via metallographic cross sectioning. There were four raw card technologies and eight different components to represent a worst case product hardware test. Each component was reworked on a solder fountain the maximum amount required for each card technology. The solder contact time was kept the same for each component and varied slightly for different component type with the total solder contact time up to about 200 seconds. Final measurements (after maximum number of reworks) were taken via metallographic cross sectioning within the module site and in the adjacent plated through holes next to the module site. All data points were averaged for each module site. All averaged module site data points were averaged for each module type. The averaged final measurements were subtracted from the averaged initial measurements to determine the averaged amount of copper dissolved. These values were averaged with all components for each of the copper levels and plotted on a "Copper Dissolved vs. % Copper in Solder" graph. Photomicrographs at time zero, and after four reworks with virgin solder and after four reworks with 0.14% copper doped solder depict the advantage of copper doping. The figure indicates that in the ternary solders as well as in the binary discussed above, the amount of copper dissolved drops dramatically with the addition of copper dopant and continues to drop as more dopant is added, up to the limit tested.

In sum, the experiments have shown that the solder compositions selected below the binary tin-copper eutectic point are desirable for soldering and rework of copper and copper clad materials for the following reasons:

(a) they can be used for assembly and rework at soldering temperatures lower than the soldering temperatures required for solder compositions above the binary tin-copper eutectic point;

(b) they demonstrate improved fatigue integrity compared to solder compositions above the binary tin-copper eutectic point;

(c) they dissolve copper from the workpiece at a slow rate, comparable to solders containing amounts of copper above the binary tin-copper eutectic point; and (d) they demonstrate improved solderability over solder compositions above the binary tin-copper eutectic point.

It will be obvious to those skilled in the art that while the composition of the present invention has been effective in soldering and reworking copper coated circuit boards, it is equally applicable to soldering any material that comprises copper and for which low temperature soldering is desirable or necessary.

I claim:

1. A low melting temperature solder composition, wherein the solder is nominally comprised of about 54 wt. % tin/26 wt. % lead/20 wt. % indium, and doped with about 0.12 to about 0.20 wt. % copper.

2. A copper containing electronic device which includes a low melting temperature solder composition nominally comprised of about 54 wt. % tin/26 wt. % lead/20 wt. % indium and is doped with about 0.12 to about 0.20 wt. % copper.

3. A method of making a copper containing electronic device which comprises the step of soldering at least once onto a copper containing metal using a low melting temperature solder which is nominally comprised of about 54 wt. % tin/26 wt. % lead/20 wt. % indium, and is doped with about 0.12 to about 0.20 wt. % copper.

* * * * *